United States Patent
Doris et al.

(10) Patent No.: US 8,664,979 B2
(45) Date of Patent: Mar. 4, 2014

(54) TRACK AND HOLD CIRCUIT USING A BOOTSTRAPPING CIRCUIT

(75) Inventors: Konstantinos Doris, Amsterdam (NL); Erwin Janssen, Veldhoven (NL); Anton Zanikopoulos, Eindhoven (NL); Alessandro Murroni, Eindhoven (NL)

(73) Assignee: NXP B.V., Eindhoven (NL)

( * ) Notice: Subject to any disclaimer, the term of this patent is extended or adjusted under 35 U.S.C. 154(b) by 154 days.

(21) Appl. No.: 13/094,978

(22) Filed: Apr. 27, 2011

(65) Prior Publication Data

US 2012/0274362 A1   Nov. 1, 2012

(51) Int. Cl.
*G11C 27/02* (2006.01)

(52) U.S. Cl.
USPC ............................ 327/94; 327/390; 327/589

(58) Field of Classification Search
USPC ........................................... 327/94, 589, 390
See application file for complete search history.

(56) References Cited

U.S. PATENT DOCUMENTS

| | | | | |
|---|---|---|---|---|
| 6,072,355 A * | 6/2000 | Bledsoe | ........................ | 327/390 |
| 6,265,911 B1 * | 7/2001 | Nairn | .............................. | 327/94 |
| 6,525,574 B1 * | 2/2003 | Herrera | .......................... | 327/94 |
| 6,972,706 B2 * | 12/2005 | Snoeijs | ......................... | 341/158 |
| 7,218,154 B1 * | 5/2007 | Pantuček et al. | ................ | 327/94 |
| 7,397,284 B1 * | 7/2008 | Liu | ................. | 326/88 |
| 7,834,786 B2 * | 11/2010 | Kawahito et al. | ............. | 341/120 |

OTHER PUBLICATIONS

Abo et al., A 1.5-V, 10 bit, 14.3-MS/s CMOS Pipeline Analog-to-Digital Converter, IEEE Journal of Solid State Circuits. vol. 34, No. 5, May 1999.
Extended European Search Report in European Patent Application No. 12165304.2 dated Jun. 28, 2012.

* cited by examiner

*Primary Examiner* — Kenneth B. Wells (57) ABSTRACT

Various exemplary embodiments relate to a tracking system and method. The system includes a transistor switch having a gate node and a source node, a power source circuit connected to the gate node, and a bootstrapping circuit connected to the source node and to the gate node. The power source circuit charges the switch during a first tracking phase, and the bootstrapping circuit charges the switch during a second tracking phase.

18 Claims, 9 Drawing Sheets

OFF

TRACK AND HOLD CIRCUIT USING A BOOTSTRAPPING CIRCUIT

TECHNICAL FIELD

Various exemplary embodiments disclosed herein relate generally to tracking and hold operations for an analog-to-digital converter.

BACKGROUND

An analog-to-digital converter (ADC) is a device which converts a continuous signal to a discrete-time digital representation. ADCs typically use a track and hold (T/H) device to sample the continuous signal. The T/H device holds a voltage value of the continuous signal constant for a period of time so that the ADC may assign a digital number proportional to the magnitude of the voltage at that moment in time.

SUMMARY

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate a tracking system, including: a transistor switch having a gate node and a drain node, a power source circuit connected to the gate node, and a bootstrapping circuit connected to the drain node and to the gate node; wherein the power source circuit charges the switch during a first tracking phase, and wherein the bootstrapping circuit charges the switch during a second tracking phase.

Various exemplary embodiments further relate to a method for performing a tracking operation on an input signal, including: charging a transistor switch with a power source circuit during a first tracking phase, the power source circuit being connected to a gate node of the transistor switch; and charging the transistor switch with a bootstrapping circuit during a second tracking phase, the bootstrapping circuit being connected to the gate node and a drain node of the transistor switch.

In some embodiments, a voltage between the gate node and the drain node is dependent on the input signal during the first tracking phase. In some embodiments, a voltage between the gate node and the drain node is substantially constant during the second tracking phase. In some embodiments, the power source circuit charges a parasitic capacitance. In some embodiments, the bootstrapping circuit comprises a capacitor. In some embodiments, the power source circuit does not charge the transistor switch during the second tracking phase. In some embodiments, the first and second tracking phases are triggered by control signals from a timing generator. In some embodiments, the timing generator generates the control signals based on a main clock of the tracking system. In some embodiments, the first tracking phase occurs during a first clock cycle of the main clock and the second tracking phase occurs during a second clock cycle of the main clock. In some embodiments, the first and second tracking phases both occur during a clock cycle of the main clock.

BRIEF DESCRIPTION OF THE DRAWINGS

In order to better understand various exemplary embodiments, reference is made to the accompanying drawings, wherein.

DETAILED DESCRIPTION

Referring now to the drawings, in which like numerals refer to like components or steps, there are disclosed broad aspects of various exemplary embodiments.

According to the foregoing, various exemplary embodiments provide for a system and method for a two-phase tracking operation in an analog-to-digital converter.

It should be appreciated by those skilled in the art that any block diagrams herein represent conceptual views of illustrative circuitry embodying the principles of the embodiments of the invention.

A sampling operation of a signal may include two operations, a tracking operation and a hold operation. Circuitry that may perform these operations is called a Track/Hold (T/H) circuit. In an interleaved analog-to-digital converter (ADC), many of these circuits may be multiplexed in time.

Figure 1A:
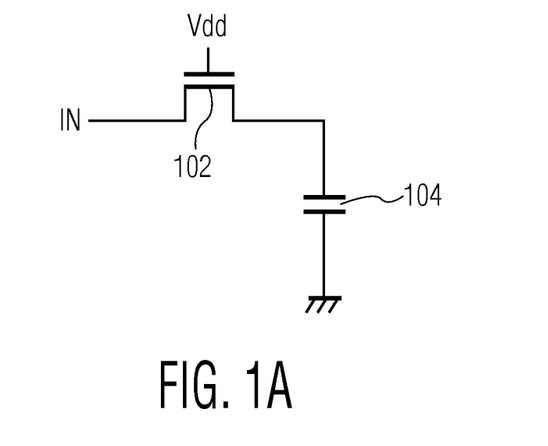
FIG. 1a illustrates an exemplary implementation of a tracking operation.
Figure 1B:
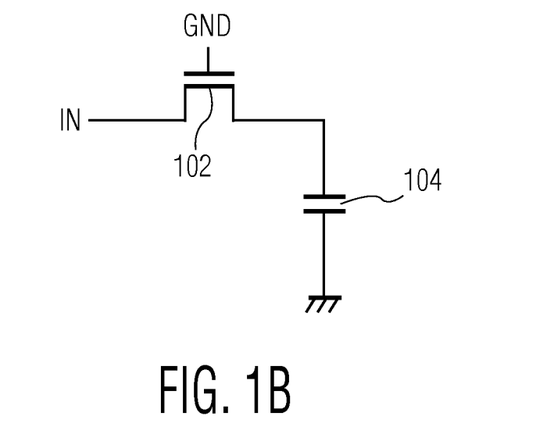
FIG. 1b illustrates an exemplary implementation of a hold operation.

An NMOS switched capacitor implementation of the tracking operation is shown in FIG. 1a. During the tracking operation the gate terminal of a switch transistor 102 may be connected to a supply ($V_{dd}$) to keep the switch transistor 102 on and allow the input signal ("IN") to charge a sampling capacitor 104. An NMOS switched capacitor implementation of the hold operation is shown in FIG. 1b. In the hold operation, the gate terminal of the switch transistor 102 may be connected to ground to switch off the path between the input signal ("IN") and the sampling capacitor 104. The sampling capacitor 104 then may store the instantaneous value of the input signal.

A limitation of the T/H implementation shown in FIGS. 1a and 1b may be bandwidth modulation during the tracking operation. The available bandwidth may be partially determined by the on-resistance ($R_{on}$) of the switch transistor 102 and the size of the sampling capacitor 104. The size of the sampling capacitor 104 may be influenced by thermal noise considerations. Thermal noise on capacitors is proportional to kT/C, k being the Boltzmann constant, T the temperature, and C the capacitance.

The $R_{on}$ of the switch transistor 102 is inversely proportional to $V_{gs}$, and linearly proportional to the width/length of the switch transistor 102. Thus, the modulation of $V_{gs}$ (where $V_{gs}=V_{dd}-V_{in}$) may introduce a corresponding modulation to $R_{on}$, and thus on the bandwidth, which may translate to signal distortion. The bandwidth modulation may influence the resolution and speed of the ADC.

In order to increase the resolution of the ADC, the size of the sampling capacitor 104 may be increased. In general, for each extra bit of resolution needed in the ADC, the size of the sampling capacitor 104 may be increased approximately four times to reduce the thermal noise also by 1 bit. However, as previously noted, a larger capacitor may reduce bandwidth. To overcome this reduction in bandwidth, a larger transistor width may be needed to reduce $R_{on}$ and increase the bandwidth. However, the size of the switch transistor 102 may also influence the sampled signal.

During the transition from the tracking operation to the hold operation, the charge stored in the NMOS channel of the switch transistor 102 may be injected from the drain and source, which may alter the sampled signal. This charge is proportional to the width/length dimensions of the switch transistor 102. The charge injected from the source of the transistor 102 is proportional to the value of $V_{gs}$ at the moment of the transition ($V_{gs}=V_{dd}-V_{in}(t)$, where $t=nT_s$, with $T_s$ being the sampling period and n being the sample number). This charge may create a signal dependent offset and distortion. Similarly, the charge injected from the drain of the transistor 102 on the sampling capacitor 104 may further distort the sampled signal.

Figure 2A:
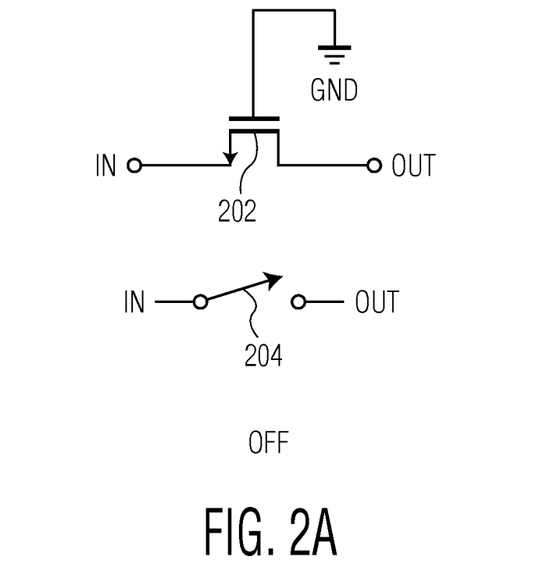
FIGS. 2a and 2b illustrate a conceptual implementation of a bootstrapping technique.
Figure 2B:
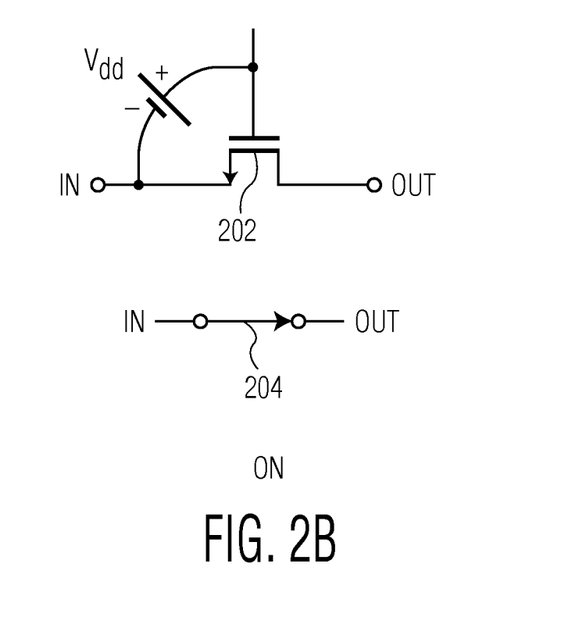

A bootstrapped tracking operation was introduced by A. M. Abo and P. R. Gray in "A 1.5-V, 10-bit, 14.3-MS/s CMOS Pipeline Analog-to-Digital Converter", Journal of Solid State Circuits, vol 34, pp. 599-606, and is hereby incorporated by reference for all purposes. The bootstrapped tracking operation may allow the switch transistor 102 to be driven with a constant overdrive (typically $V_{dd}$), independent of the input signal. FIGS. 2a and 2b show a conceptual implementation of the bootstrapping technique. A switch 204 is conceptually represented by a single NMOS transistor 202. In the "OFF" state, the gate of the transistor 202 may be grounded and the switch 204 may be open. In the "ON" state, a constant voltage of $V_{dd}$ may be applied across the gate and source terminals of the transistor 202, and the switch 204 may be closed. A low $R_{on}$ of the transistor 202 may be established from the drain to source, independent of the input signal. Although the absolute voltage applied to the gate of the transistor 202 may exceed $V_{dd}$ for a positive input signal, none of the relative terminal-to-terminal voltages of the transistor 202 may exceed $V_{dd}$.

Figure 3:
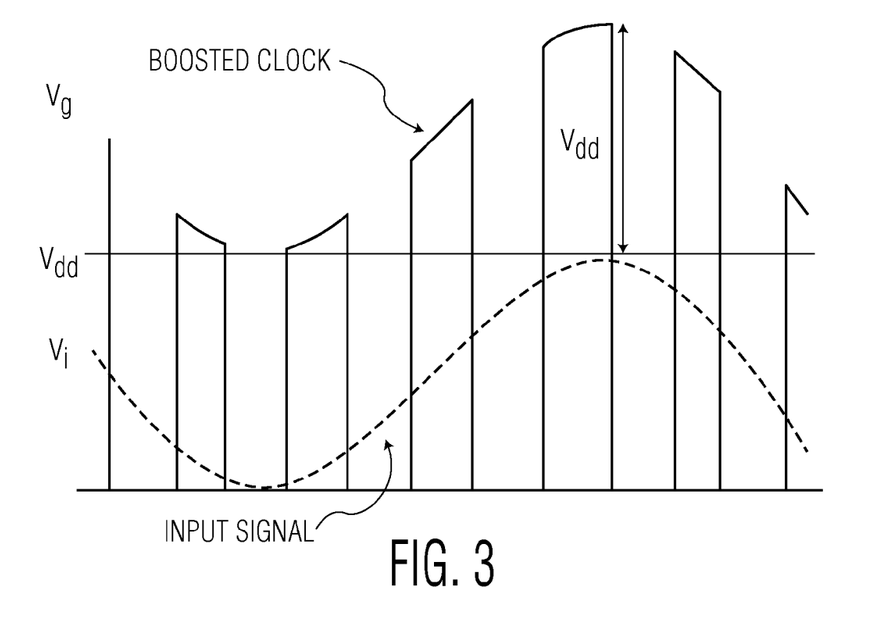
FIG. 3 illustrates a conceptual signal diagram for the bootstrapping technique of FIGS. 2a and 2b.

FIG. 3 shows a conceptual signal diagram of a bootstrapped tracking operation. When the switch 202 is "ON," the voltage at the gate of the transistor 204 ("$V_g$") may be boosted by $V_{dd}$. Therefore, when the switch is "ON", the voltage $V_g$ may be at minimum $V_{dd}$, and will vary according to the input signal.

Figure 4:
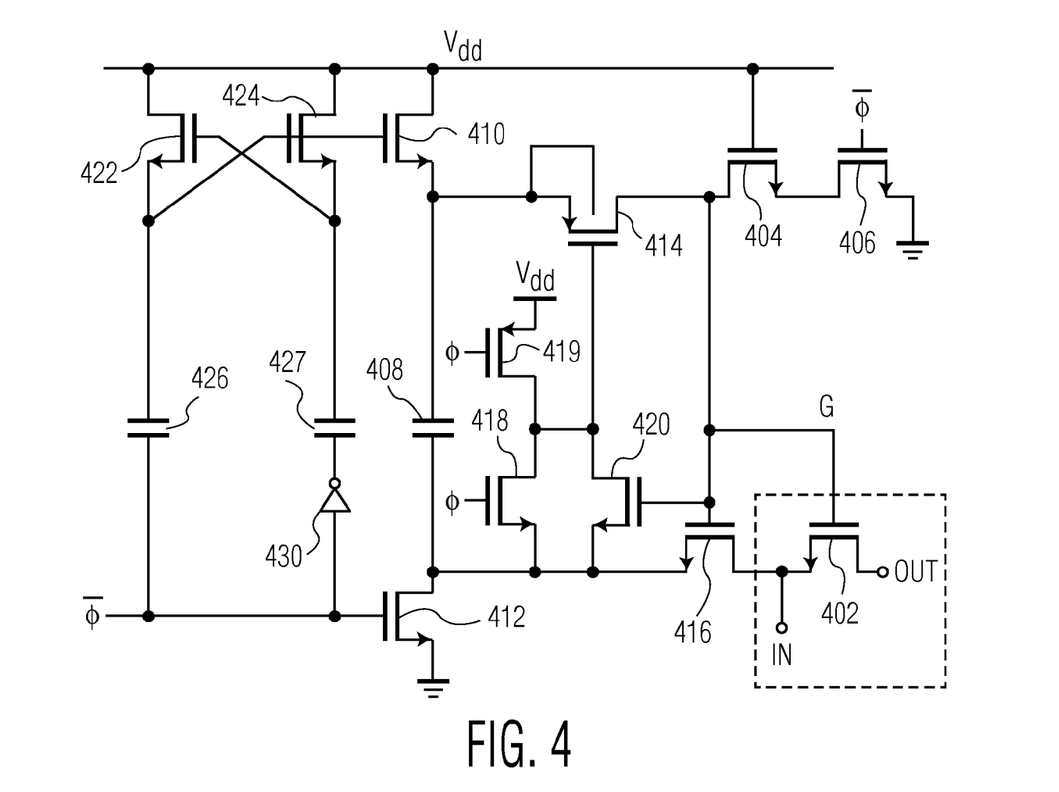
FIG. 4 illustrates an exemplary circuit implementation for the bootstrapping technique of FIGS. 2a and 2b.

A circuit implementation of a bootstrapped tracking operation is shown in FIG. 4. The circuit in FIG. 4 may operate on a single phase clock Φ that may turn a switch transistor 402 on and off. The switch transistor 402 performs a switching operation similar to what is shown in FIGS. 2a and 2b. During the "OFF" state, Φ is low. Transistors 404 and 406 may discharge the gate of the switch transistor 402 to ground. At the same time, $V_{dd}$ may be applied across a bootstrapping capacitor 408 by transistors 410 and 412. The bootstrapping capacitor 408 may act as a power source across the gate and source of the switch transistor 402 during the "ON" state. Transistors 414 and 416 may isolate the switch transistor 402 from the bootstrapping capacitor 408 while it is charging. When Φ goes high, triggering the "ON" state, transistors 418 and 419 may pull down the gate of transistor 414, allowing charge from the bootstrapping capacitor 408 to flow onto the gate of the switch transistor 402. This may turn on both transistor 416 and the switch transistor 402. Transistor 416 may enable the gate of the switch transistor 402 to track the input signal ("IN") shifted by $V_{dd}$, keeping the gate-source voltage of the switch transistor 402 substantially constant regardless of the input signal. For example, if the input signal is $V_{dd}$, then the gate of the switch transistor 402 would be $2V_{dd}$. At the same time, the $V_{gs}$ voltage of the switch transistor 402 would be $V_{dd}$, which may enhance the reliability of the switch transistor 402, as the difference between the gate and source terminals would not exceed $V_{dd}$.

Transistor 404 may reduce the $V_{gs}$ and $V_{gd}$ voltages experienced by transistor 406 when Φ is low. Transistor 420 may ensure that the $V_{gs}$ of transistor 414 does not exceed $V_{dd}$. Transistor 422, transistor 424, capacitor 426, capacitor 428, and inverter 430 form a clock multiplier that may enable transistor 410 to uni-directionally charge the bootstrapping capacitor 408 during the "OFF" state.

Sampling rates in the giga-sample per second (GS/s) range with wide bandwidth, high linearity, and low noise may be difficult to apply to the bootstrapped tracking circuit shown in FIG. 4 for the following various reasons.

The transition from "OFF" to "ON" of the switch transistor 402 may be realized by a charge re-distribution between the charge stored at the top-plate of the bootstrapping capacitor 408 and parasitic capacitance at node G. A large bootstrapping capacitor 408 and a large transistor 414 may be necessary to provide a very low ohmic path between node G and the bootstrapping capacitor 408, otherwise the transition of the switch transistor 402 from "OFF" to "ON" may not occur quickly enough to properly sample the input signal. A slow transition may substantially limit the tracking capability of the T/H circuit.

Ideally, the gate of the switch transistor 402 would be charged to at least $V_{dd}$, but due to the large parasitic capacitance present at node G, it may actually be charged to a smaller value. This may translate to a loss of efficiency for the switch transistor 402. Charge sharing between the top-plate of the bootstrapping capacitor 408 and the parasitic capacitance at node G also may reduce the boosted voltage during the bootstrapped tracking operation.

The bootstrapped tracking operation may be partially enabled by transistor 416, and may occur only after the voltage at the gate of the switch transistor 402 has reached a necessary level. This may delay the time for the bootstrapping to become effective, and may reduce the available tracking time.

A large bootstrapping capacitor 408 may be required for effective bootstrapping and for a quick "OFF" to "ON" transition. However, at high sampling rates the bootstrapping capacitor 408 may need to be re-charged very quickly, which means the transistors connected to it (e.g. transistors 410, 412, 414, and 416) may also be large. Large transistors may introduce additional parasitic capacitances. The bootstrapping capacitor 408 may also introduce a large parasitic capacitance to ground due to its size. All these parasitic capacitors may increase the charge sharing effect even further, lowering the charge seen at node G of the switch transistor 402.

The large bootstrapping capacitor 408 and large transistors may also introduce significant parasitic capacitance at the input node ("IN"). This may translate to large disturbances at the input node that take time to settle. This may limit the sampling rate of the ADC. The parasitic capacitances of the bootstrapping capacitor 408 and the large transistors may also create a signal delay.

The bootstrapped tracking circuit shown in FIG. 4 may occupy a large silicon area. When many time-interleaved T/H circuits are used to achieve higher sampling rates, the bootstrapped tracking circuitry may cause each T/H circuit to be further away from each other. This may increase the clock and signal distribution interconnect lengths, further limiting bandwidth and creating negative impact on the timing accuracy of each switching transistor.

Embodiments of the invention described herein decrease the impact of parasitic capacitors significantly, and for this reason improve on all aspects mentioned in the previous paragraphs.

Figure 5A:
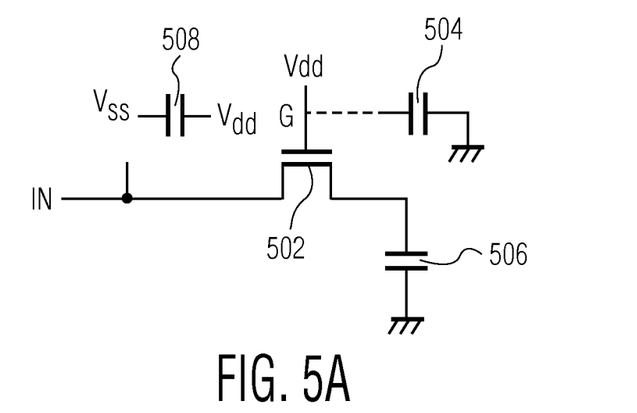
FIG. 5a illustrates an exemplary implementation of tracking phase A.
Figure 5B:
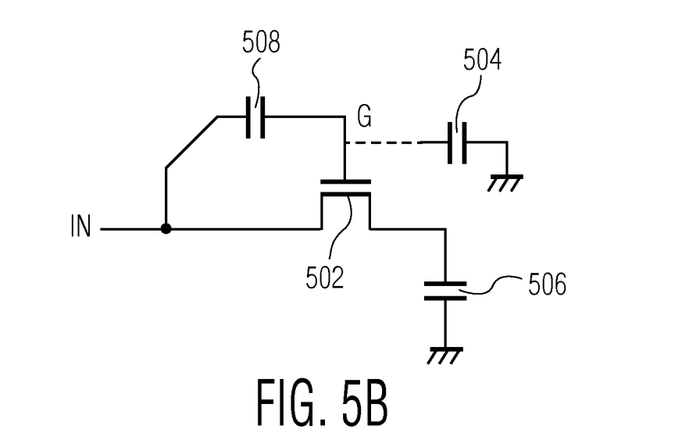
FIG. 5b illustrates an exemplary implementation of tracking phase B.
Figure 5C:
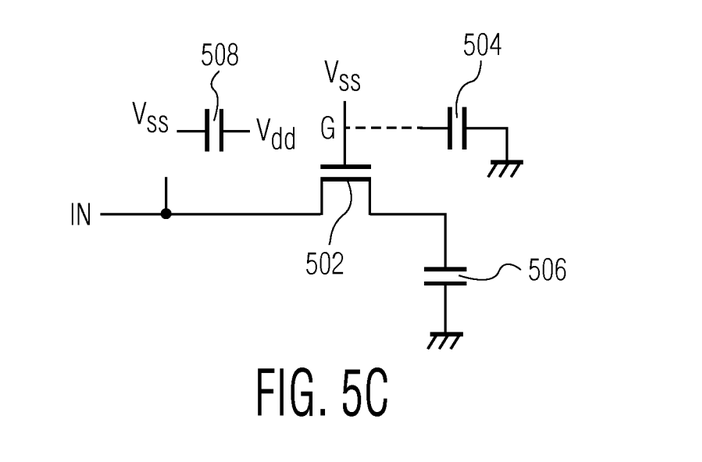
FIG. 5c illustrates an exemplary implementation of hold phase C.

A conceptual schematic of an embodiment of the present invention is shown in FIGS. 5*a*, 5*b*, and 5*c*, and will be further explained in the following paragraphs.

Embodiments of the present invention may eliminate the need to use the charge stored in a bootstrapping capacitor to quickly charge a switch transistor gate node to $V_{dd}$. Therefore, the bootstrapping capacitor may be substantially smaller, improving significantly the performance of the tracking operation, compared to the operation described in FIGS. 2, 3, and 4.

The tracking operation may be divided into two phases as shown in FIGS. 5*a* and 5*b*. In tracking phase A, as shown in FIG. 5*a*, the gate of the switch transistor 502 may be charged directly to $V_{dd}$, as it is done with non-bootstrapped switch transistors (e.g., FIG. 1*a*). This may charge the parasitic capacitor 504 present at node G to $V_{dd}$ quickly, and may maximize the instantaneous bandwidth available ($V_{gs}=V_{g(t)}-V_{in}$, where t is the moment node G is switched from ground (or $V_{ss}$ to $V_{dd}$). This may allow for fast recovery from a previous sample stored in a sampling capacitor 506. Also during tracking phase A, a bootstrap capacitor 508 may be charged by $V_{dd}$.

In tracking phase B, as shown in FIG. 5*b*, a bootstrap capacitor 508 may be operated similarly to the bootstrapped tracking operation shown in FIGS. 2 and 4. A fast rising edge of the voltage at the gate of the switch transistor 502 may trigger the start of tracking phase B, similar to the circuit in FIG. 4. Alternatively, phases A and B may be triggered independently from each other with corresponding control signals.

In phase B, no charge may need to be used from the bootstrap capacitor 508 as a result of the separate charging path to $V_{dd}$ that took place in phase A. The bootstrap capacitor 508 may only be required to enable the switch transistor 502 to track the input signal ("IN").

Charge losses due to the parasitic capacitor 504 in the initial portion of the tracking operation may be significantly reduced, and the bootstrapping voltage may start from at least $V_{dd}$. This may allow for a smaller bootstrapping capacitor 508 as compared to the bootstrapping capacitor 408 of FIG. 4, as well as smaller transistors connected to the bootstrapping capacitor, as shown later in FIGS. 7 and 9. A significant positive impact on bandwidth, sampling rate, and linearity may be achieved by the two-phase bootstrapping operation compared to the bootstrapping operation of FIGS. 2 and 4.

The capacitive voltage division between the parasitic capacitor 504 and the bootstrapping capacitor 508 during phase B may remain. However, the bootstrapping capacitor 508 may not need to charge the parasitic capacitor 504 from ground to $V_{dd}$ before it enables the bootstrapping operation, resulting in a significant reduction of the parasitic capacitance. As a result, if the bootstrapping capacitor 408 of FIG. 4 and the bootstrapping capacitor 508 were the same value, the voltage division due to parasitic capacitances may be significantly smaller with the bootstrapping capacitor 508.

After tracking phases A and B, the circuit may enter hold phase C, as shown in FIG. 5*c*. The node G may be connected to $V_{ss}$ or ground, to switch off the path between the input signal and the sampling capacitor 506. The sampling capacitor 506 then stores the instantaneous value of the input signal. The bootstrap capacitor 508 may also be charged by $V_{dd}$ during hold phase C.

Figure 6:
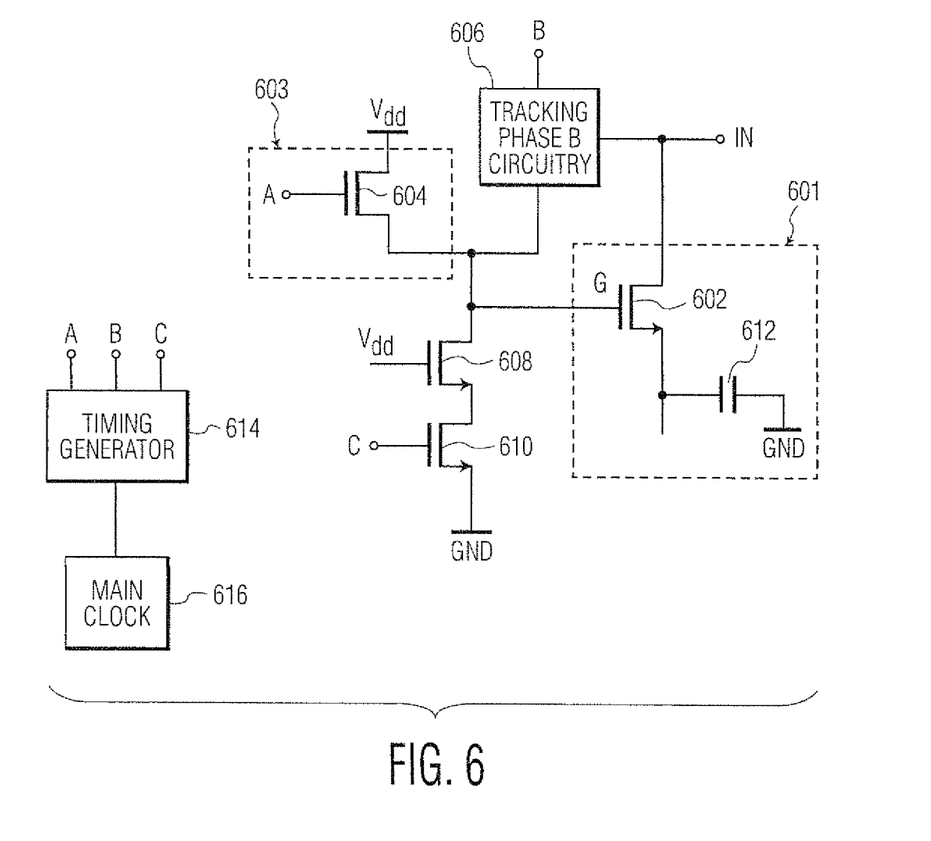
FIG. 6 illustrates an exemplary embodiment of a T/H circuit with a two-phase tracking operation.

An embodiment of a T/H circuit including a two-phase tracking operation is shown in FIG. 6. Tracking phase A circuitry 603 may include transistor 604. Transistor 604 may provide a path to $V_{dd}$ for the gate of switch transistor 602 during tracking phase A. In tracking phase B, transistor 604 may be turned off, and tracking phase B circuitry 606 may enable a bootstrapped tracking operation. In hold phase C, the gate of the switch transistor 602 may be connected to ground via transistors 608 and 610. The instantaneous value of the input signal ("IN") may then be stored in sampling capacitor 612. The switch transistor 602 and sampling capacitor 612 form sampling circuitry 601, similar to the T/H implementation of FIGS. 1*a* and 1*b*. A timing generator 614 may supply control signals to nodes A, B, and C to define the scheduling of the three phases. The timing generator 614 may generate the control signals based on a main clock 616 of the ADC.

Figure 7:
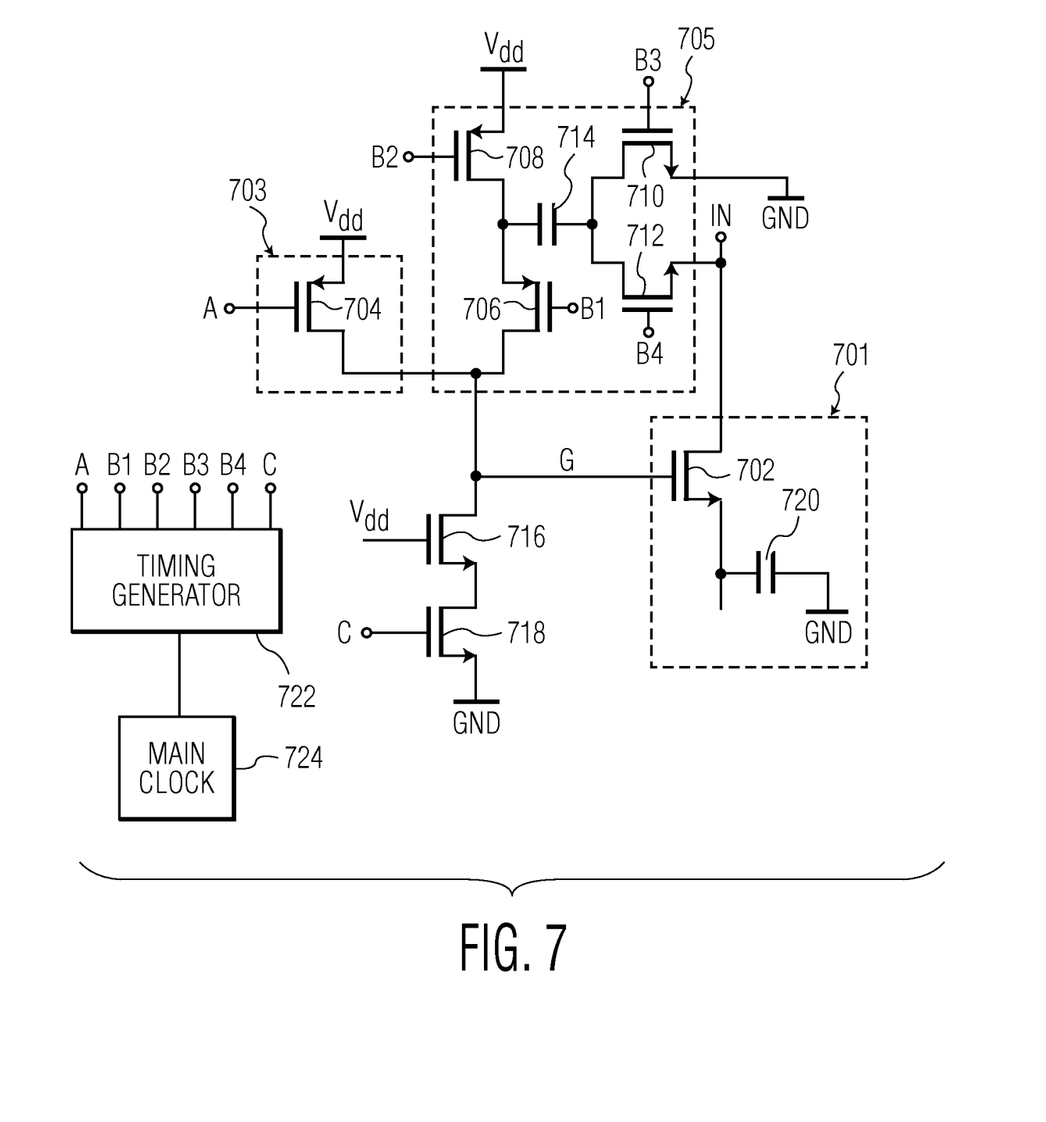
FIG. 7 illustrates an exemplary implementation of the embodiment of FIG. 6.

FIG. 7 is an exemplary implementation of the embodiment of the T/H circuit of FIG. 6. As in FIG. 6, tracking phase A circuitry 703 may include transistor 704. Transistor 704 may provide a path to $V_{dd}$ for the gate of switch transistor 702 during tracking phase A. In tracking phase B, transistor 704 may be turned off, and tracking phase B circuitry 705 may enable a bootstrapped tracking operation. The tracking phase B circuitry 705 may include transistors 706, 708, 710, and 712, and a bootstrapping capacitor 714. Transistors 708 and 710 may provide a path for bootstrapping capacitor 714 to be charged by $V_{dd}$. Transistors 706 and 712 may provide a path for the bootstrapping capacitor 714 to the gate and drain of switch transistor 702. In hold phase C, the gate of the switch transistor 702 may be connected to ground via transistors 716 and 718. The instantaneous value of the input signal ("IN") may then be held in sampling capacitor 720. The switch transistor 702 and sampling capacitor 720 form sampling circuitry 701, similar to the T/H implementation of FIGS. 1*a* and 1*b*. A timing generator 722 may supply control signals to nodes A, B1, B2, B3, B4, and C to define the scheduling of the three phases. The timing generator 722 may generate the control signals based on a main clock 724 of the ADC.

The transistors in the tracking phase B circuitry 705 may be controlled with independent timing signals to reduce loading at node G and to create less parasitic capacitance and a faster pull-down for the hold phase C.

The example implementation in FIG. 7 may allow the bootstrap capacitor 714 to have more time to charge to $V_{dd}$. This may enable the use of a smaller transistor 704 for further reduction of parasitic capacitance, and may improve the capacitor divider effect in the tracking phase B.

Figure 8:
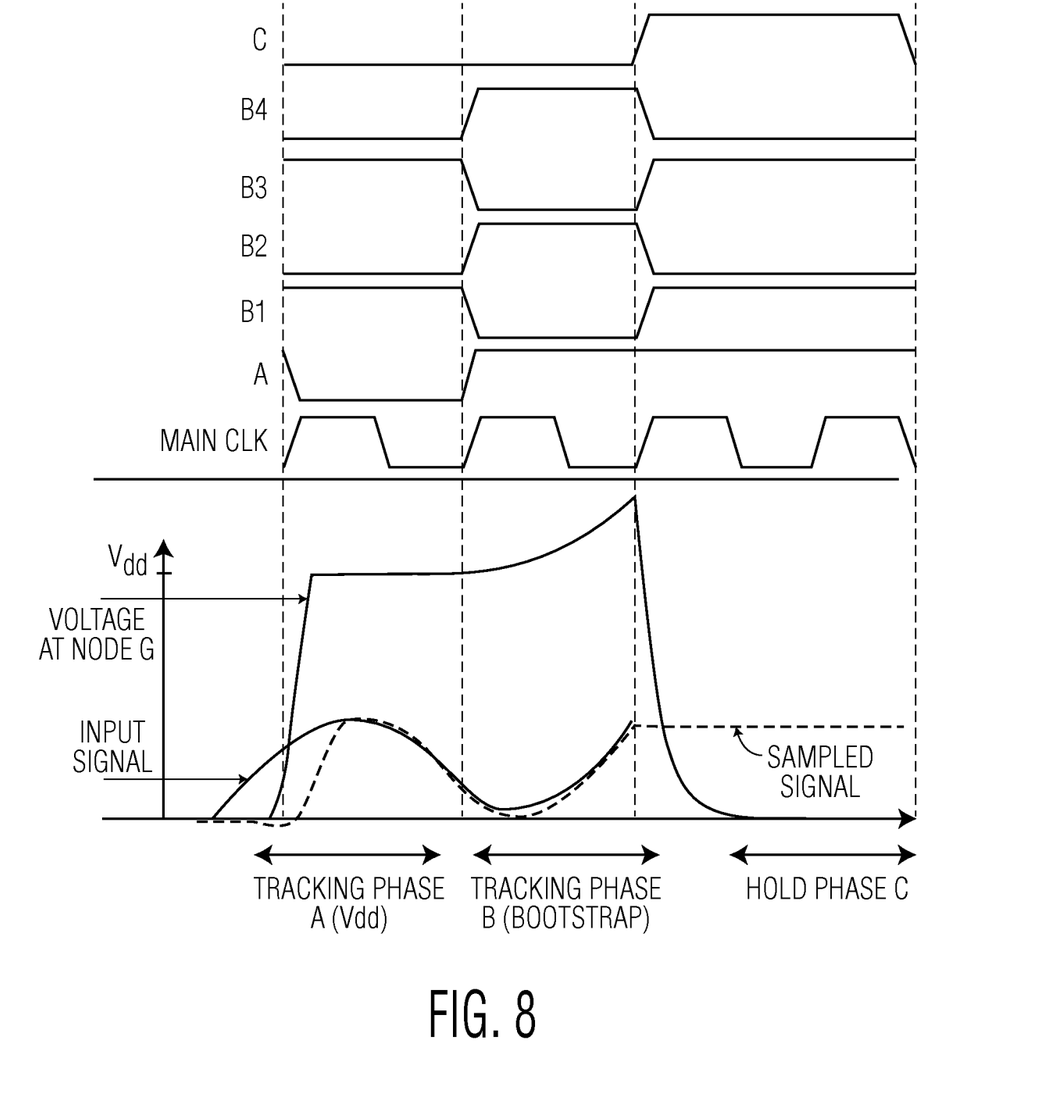
FIG. 8 illustrates an exemplary timing diagram for the embodiment of FIG. 7.

Tracking phases A and B may be defined by the main clock 724 and have a fixed duration, for example one period of the main clock of the ADC, as shown in FIG. 8.

Transistors 702, 706, and 708 may be thick oxide transistors to optimize the total behavior for low leakage current during tracking phase B.

FIG. 8 shows an exemplary timing diagram for the embodiment of FIG. 7. In this example, tracking phases A and B may last for one period of the main clock each, and the hold phase C may last for two periods. The timing of phases A, B, and C may be modified to be shorter and/or longer. In tracking phase A, the voltage at node G may be charged to $V_{dd}$, independently of the input signal. In tracking phase B, the voltage at node G may remain boosted by $V_{dd}$ and also may track with the input signal. In hold phase C, the voltage at node G may drop to ground, and the sampled signal may hold its value substantially constant for a period of time to be sampled.

Tracking phase A may be triggered when control signal A is low, control signal B1 is high, control signal B2 is low, control signal B3 is high, control signal B4 is low, and control signal C is low. Tracking phase B may be triggered when control signal A is high, control signal B1 is low, control signal B2 is high, control signal B3 is low, control signal B4 is high, and control signal C is low. Hold phase C may be triggered when control signal A is high, control signal B1 is high, control signal B2 is low, control signal B3 is high, control signal B4 is low, and control signal C is high.

The control signals shown in FIG. 8 are examples of the logical (i.e. high/low) waveforms used to define the scheduling of the three phases. The actual signals supplied to the gates of transistors 704, 706, 708, 710, 712, and 718 may vary in waveform and/or timing. For example, the signals may be advanced or delayed, and/or the signals may be boosted with additional bootstrapping circuitry.

Figure 9:
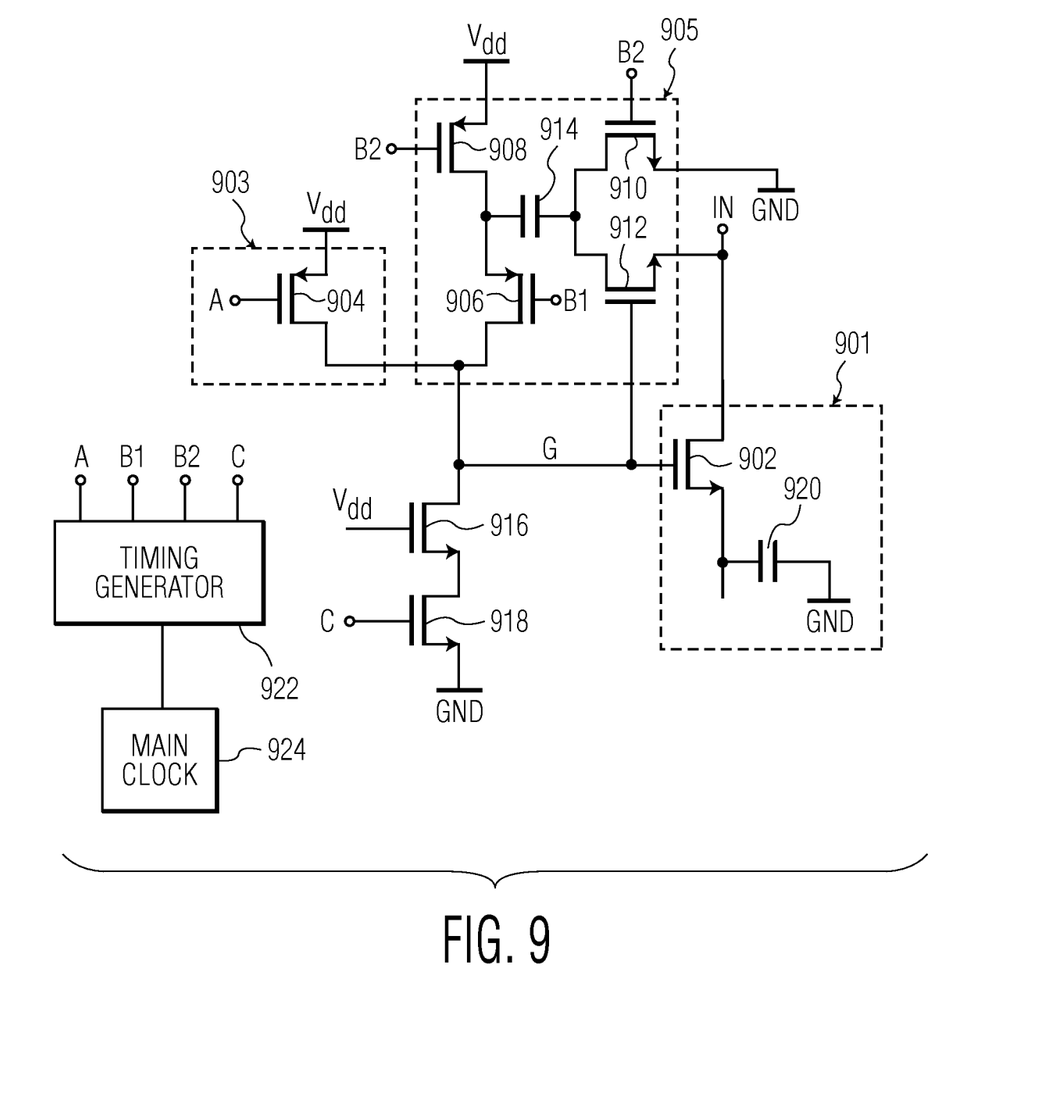
FIG. 9 illustrates another exemplary implementation of the embodiment of FIG. 6.

Another embodiment illustrating another example implementation is shown in FIG. 9. Similar to the implementation shown in FIG. 7, tracking phase A circuitry 903 may include transistor 904. Transistor 904 may provide a path to $V_{dd}$ for the gate of switch transistor 902 during tracking phase A. In tracking phase B, transistor 902 may be turned off, and tracking phase B circuitry 905 may enable a bootstrapped tracking operation. The tracking phase B circuitry 905 may include transistors 906, 908, 910, and 912, and a bootstrapping capacitor 914. In hold phase C, the gate of the switch transistor 902 may be connected to ground via transistors 916 and 918. The instantaneous value of the input signal ("IN") may then be held in sampling capacitor 920. The switch transistor 902 and sampling capacitor 920 form sampling circuitry 901, similar to the T/H implementation of FIGS. 1a and 1b. A timing generator 922 may supply control signals to nodes A, B1, B2, and C to define the scheduling of the three phases. The timing generator 922 may generate the control signals based on a main clock 924 of the ADC. In this implementation, transistors 908 and 912 may not receive independent timing signals. Transistors 902, 906, and 908 may be thick oxide transistors.

Figure 10:
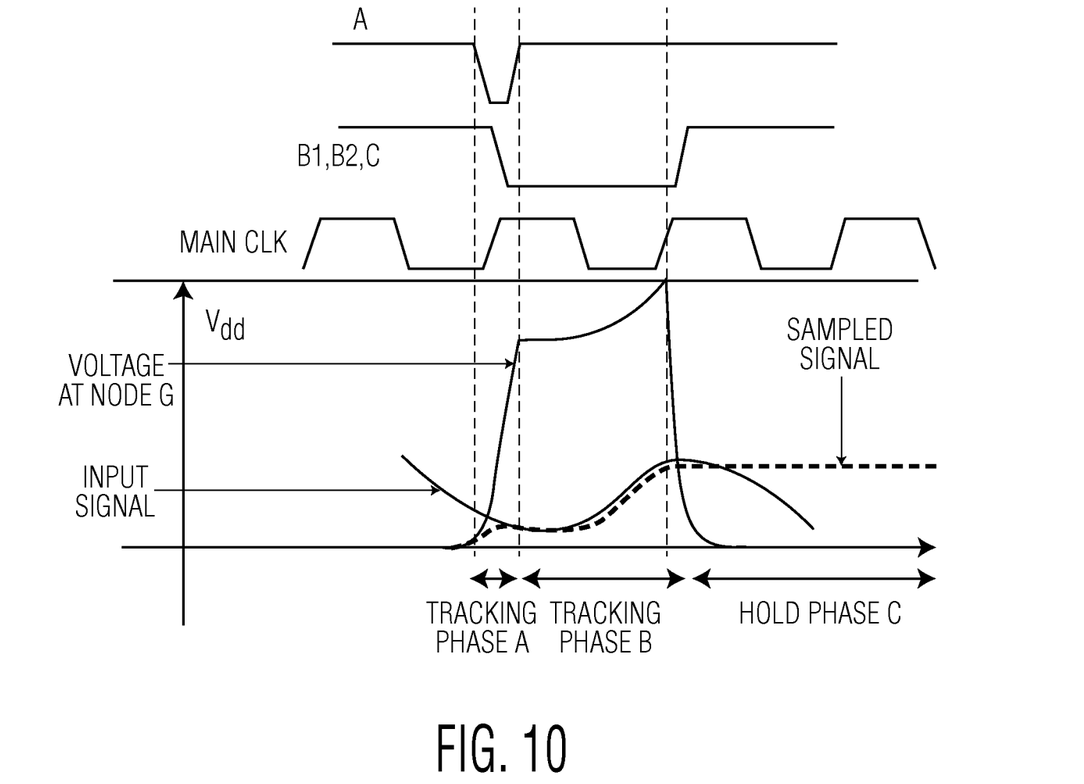
FIG. 10 illustrates an exemplary timing diagram for the embodiment of FIG. 9.

FIG. 10 shows an exemplary timing diagram for the embodiment of FIG. 9. In this example, tracking phases A and B may occur during the same clock cycle, with tracking phase A lasting only long enough to charge node G to $V_{dd}$ and tracking phase B starting with a pre-charged node G. In hold phase C, the voltage at node G may drop to ground, and the sampled signal may hold its value substantially constant for a period of time to be sampled.

Control signals B1, B2, and C may use the same logical waveform. Tracking phase A may be triggered when control signal A is low and control signals B1, B2, and C are high. Tracking phase B may be triggered when control signal A is high and control signals B1, B2, and C are low. Hold phase C may be triggered when control signals A, B1, B2, and C are high.

The control signals shown in FIG. 10 are examples of the logical (i.e. high/low) signals used to define the scheduling of the three phases. The actual signals supplied to the gates of transistors 904, 906, 910, and 918 may vary in waveform and/or timing. For example, the signals may be advanced or delayed, and/or the signals may be boosted with additional bootstrapping circuitry.

The pre-charge path is not limited to the implementations shown in the previous examples, and the bootstrap path is not limited to the implementations using capacitors (passive bootstrapping), but may also be implemented with active bootstrapping. With active bootstrapping, the tracking phase B circuitry shown in FIG. 6 may be a buffer circuit, which may supply a replica version of the input signal with a corresponding voltage offset, e.g., $V_{dd}$. A two-phase tracking operation with active bootstrapping may substantially reduce the slew rate requirements of the buffer circuit, which may translate to major power savings and increased speed.

The two-phase tracking operation may allow for various benefits. The operation may allow a high sampling rate for high resolution ADCs because the tracking edge may be well defined, and not modulated by the input signal as in a non-bootstrapped tracking operation. The circuitry may occupy a significantly smaller area, consuming less dynamic power and causing less supply disturbances while providing larger signal bandwidth, as compared to a conventional bootstrapping circuitry. The circuitry may also be used in massively interleaved ADCs due to its small size and low power operation. Because the sampling switches may be located much closer to each other, the size of the clock network also may become smaller with benefits in timing accuracy. The circuitry may enable easier use of bootstrapping in sampling switches and analog multiplexers in an ADC.

The two-phase tracking circuitry may further enable significantly higher sampling rates for the ADC because the bootstrap capacitor may be very small and thus may be charged faster compared to conventional bootstrapping circuitry. Sampling rates of several GS/s with a resolution of 10 bits may be possible with these embodiments. The circuitry may reduce the tracking time needed because the gate of the switch transistor may be pulled to $V_{dd}$ much faster than conventional bootstrapping circuitry. The circuitry may also enable steeper hold transitions, which may result in higher linearity and timing accuracy.

A T/H circuit with a two-phase tracking operation may be used in a variety of applications, such as, for example, radar applications, high speed wireless communications, cellular communications, satellite communications, cable receivers, satellite receivers, radio astronomy applications, or other applications that may utilize several GS/s sampling rates.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A tracking system, comprising:
   a transistor switch having a gate node, a drain node, and a source node;
   a power source circuit connected to the gate node; and
   a bootstrapping circuit connected to the drain node and to the gate node, wherein the power source circuit charges the switch during a first tracking phase and the bootstrapping circuit charges the switch during a second tracking phase, the first and second tracking phases are triggered by control signals from a timing generator, and the control signals control separate charging paths, each path respectively corresponding to the first tracking phase and the second tracking phase.

2. The system of claim 1, wherein a voltage between the gate node and the drain node is dependent on the input signal during the first tracking phase.

3. The system of claim 1, wherein a voltage between the gate node and the drain node is substantially constant during the second tracking phase.

4. The system of claim 1, wherein the power source circuit charges a parasitic capacitance.

5. The system of claim 1, wherein the bootstrapping circuit comprises a capacitor.

6. The system of claim 1, wherein the power source circuit does not charge the transistor switch during the second tracking phase.

7. The system of claim 1, wherein the timing generator generates the control signals based on a main clock of the tracking system.

8. The system of claim 7, wherein the first tracking phase occurs during a first clock cycle of the main clock and the second tracking phase occurs during a second clock cycle of the main clock.

9. The system of claim 7, wherein the first and second tracking phases both occur during a clock cycle of the main clock.

10. A method for performing a tracking operation on an input signal, comprising:
    charging a transistor switch with a power source circuit during a first tracking phase, the power source circuit being connected to a gate node of the transistor switch;
    charging the transistor switch with a bootstrapping circuit during a second tracking phase, the bootstrapping circuit being connected to the gate node and a drain node of the transistor switch; and
    triggering the first and second tracking phases by control signals from a timing generator, wherein the control signals control separate charging paths, each path respectively corresponding to the first tracking phase and the second tracking phase.

11. The method of claim 10, wherein a voltage between the gate node and the drain node is dependent on the input signal during the first tracking phase.

12. The method of claim 10, wherein a voltage between the gate node and the drain node is substantially constant during the second tracking phase.

13. The method of claim 10, wherein the power source circuit charges a parasitic capacitance.

14. The method of claim 10, wherein the bootstrapping circuit comprises a capacitor.

15. The method of claim 10, wherein the power source circuit does not charge the transistor switch during the second tracking phase.

16. The method of claim 10, wherein the timing generator generates the control signals based on a main clock of the tracking system.

17. The method of claim 16, wherein the first tracking phase occurs during a first clock cycle of the main clock and the second tracking phase occurs during a second clock cycle of the main clock.

18. The method of claim 16, wherein the first and second tracking phases both occur during a clock cycle of the main clock.

* * * * *

UNITED STATES PATENT AND TRADEMARK OFFICE
CERTIFICATE OF CORRECTION

| | | |
|---|---|---|
| PATENT NO. | : 8,664,979 B2 | Page 1 of 1 |
| APPLICATION NO. | : 13/094978 | |
| DATED | : March 4, 2014 | |
| INVENTOR(S) | : Konstantinos Doris et al. | |

It is certified that error appears in the above-identified patent and that said Letters Patent is hereby corrected as shown below:

Title page, item [75] INVENTOR: Please replace "ANTON ZANIKOPOULOS" with "ATHON ZANIKOPOULOS".

Signed and Sealed this
First Day of September, 2015

Michelle K. Lee
*Director of the United States Patent and Trademark Office*